United States Patent [19]

Dillard et al.

[11] 4,309,462
[45] Jan. 5, 1982

[54] CONDITIONING OF CAPROLACTAM POLYMERS FOR ELECTROLESS PLATING

[75] Inventors: David A. Dillard, Diamond Bar; Eileen Maguire, Arcadia; Lawrence P. Donovan, Temple City, all of Calif.

[73] Assignee: Crown City Plating Co., El Monte, Calif.

[21] Appl. No.: 159,503

[22] Filed: Jun. 16, 1980

Related U.S. Application Data

[63] Continuation-in-part of Ser. No. 970,929, Dec. 19, 1978, abandoned.

[51] Int. Cl.³ .............................................. B05D 3/10
[52] U.S. Cl. .................................. 427/304; 156/668; 427/305; 427/306; 427/307; 427/444
[58] Field of Search .............................. 424/304–307, 424/444; 156/668

[56] References Cited

U.S. PATENT DOCUMENTS

| | | | |
|---|---|---|---|
| 3,574,070 | 4/1971 | Sahely | 156/625 |
| 3,686,017 | 8/1972 | Menikheim et al. | |
| 4,084,023 | 4/1978 | Dafter | 427/306 |
| 4,125,649 | 11/1978 | Donovan et al. | 427/307 |

FOREIGN PATENT DOCUMENTS

| | | |
|---|---|---|
| 551820 | 3/1943 | United Kingdom . |
| 626380 | 7/1949 | United Kingdom . |
| 896606 | 5/1962 | United Kingdom . |
| 1015273 | 12/1965 | United Kingdom . |
| 1310306 | 3/1973 | United Kingdom . |

OTHER PUBLICATIONS

Brandrup et al., *Polymer Handbook,* Interscience Pub., 1966, IV–216, QD281P8B68.

*Primary Examiner*—Michael R. Lusignan
*Assistant Examiner*—Janyce A. Bell
*Attorney, Agent, or Firm*—Christie, Parker & Hale

[57] ABSTRACT

Caprolactam polymeric substrates are conditioned for electroless plating by etching with an aqueous solution of organic acid containing from 2 to 4 carbon atoms, preferably an acetic acid compound, such as trichloroacetic acid.

13 Claims, 14 Drawing Figures

CONDITIONING OF CAPROLACTAM POLYMERS FOR ELECTROLESS PLATING

CROSS-REFERENCE TO RELATED APPLICATIONS

This application is a continuation-in-part of Application Ser. No. 970,929, filed Dec. 19, 1978, now abandoned.

BACKGROUND OF THE INVENTION

The present invention relates to electroless plating of caprolactam polymers and, in particular, to provide a surface uniformly receptive to electrolessly deposited nickel and copper.

The benefits of electroless plated, non-conductive articles, particularly plastic articles, are well known. In the finished product, the desirable characteristics of the plastic and the metal are combined to offer thereby the technical and aesthetic advantages of each.

Polymeric substrates are conventionally plated by pre-etching the surface by contact with an aqueous solution of at least one organic compound active for conditioning the surface of the plastic, then etching with a strong oxidizing acid or base, seeding the surface with a noble metal catalyst, e.g. a palladium chloride solution, then immersing the seeded surface in an autocatalytic electroless solution where an initial coating of a conductive metal, e.g. copper or nickel, is established by chemical deposition. The metal deposit acts as a buss to allow a thicker coating of metal to be built up electrolytically.

Attempts to adapt conventional procedures for electroless plating of polymers to polyamides by us have resulted in a failure to achieve a uniform adherent coat of metal. Having found conventional electroless plating procedures ineffective, a quest was initiated to discover a procedure to enable uniform coating of polyamides with electroless deposited metals.

SUMMARY OF THE INVENTION

It has now been found that electroless plating of caprolactam polymers, particularly filled caprolactam polymers, can be realized by contacting a caprolactam polymer substrate with an aqueous organic acid etch solution comprising an organic acid containing from 2 to 4 carbon atoms and soluble in water to a concentration of at least 3 percent by weight. Contact is for a time sufficient to render the surface receptive to a metal catalyst and, with respect to filled caprolactam polymers, provide a microporous surface having anchor sites for the deposited plate. It is presently preferred to employ an aqueous etch solution comprising at least one acetic acid compound of the formula:

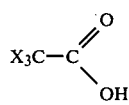

wherein each X is independently selected from the group conisting of hydrogen, hydroxyl and halogen. Trichloroacetic acid is preferred.

This is followed by seeding the surface with a metal electroless plating catalyst selected from solutions of noble metal ions and colloidal suspensions or dispersions of noble or non-noble metal particles.

Following seeding and activation of the metal catalyst by conventional means, the surface can be uniformly plated with electroless copper or nickel.

Contact time in the aqueous organic acid etch solution is normally from about 10 seconds to 15 minutes at room temperature, preferably from about 0.25 to about 3 minutes. Concentration of the organic acid compound is normally at least about 3 percent by weight of solution up to solution saturation, preferably from about 5 to about 60 percent by weight.

In carrying out the process, an alkaline conditioning solution having a pH of at least about 10, may be used to condition the substrate and if used, is preferably employed at a temperature from about 150° F. to the boiling point of the solution or the softening point of the plastic, whichever is less, preferably 170° to about 200° F. at contact times ranging from about 0.5 to about 20 minutes or more, depending on temperature and alkali compound concentration. Concentration is normally from about 2 percent by weight of solution to solution saturation, preferably from about 10 to about 50 percent by weight. It is preferred to employ a solution of an alkali metal hydroxide such as sodium or potassium hydroxide.

In conducting the process of the invention, the article may be pre-conditioned by contacting the article in an aqueous solution of an organic solvent, preferably an alkali soluble organic solvent for the caprolactam polymer in a concentration up to about 5 percent by weight, preferably up to about 1 percent by weight. Ethylene glycol, phenolic compounds such as chlorophenol, cresols and salts thereof are presently preferred. The solvent may be contained in its own bath or included in the alkali solution so long as the alkali does not hydrolyze or otherwise degrade the organic solvent. The solvent serves to soften the plastic to aid the organic acid etch but does not serve an etch function. Contact with the solvent solution is prior to contact with the acid etch.

In addition, the substrate after contact with the solution of the organic acid compound may be further processed to remove surface debris of the etching by contact with the acidic to basic wash. Alkaline rinses are preferred because acidic solutions can degrade the caprolactam. If used, acid concentration should be less that about 4 Normal, preferably less than about 3.5 Normal.

THE DRAWINGS

Attached FIG. 1 is a series of surface photomicrographs taken using a scanning electron microscope, illustrating the effect of various surface treatments on a filled caprolactam known as Capron TM 1030.

Attached FIG. 2 shows the effect of formic acid on a Capron TM m 1030 substrate.

DETAILED DESCRIPTION

Figure 1A:
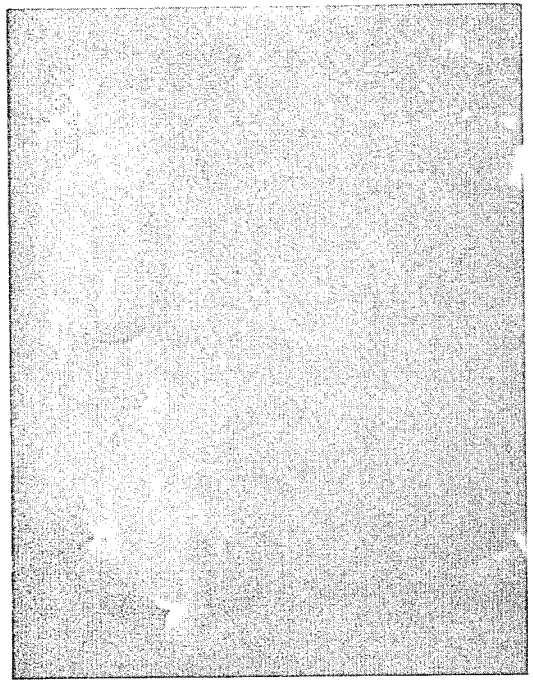

According to the present invention, there is provided a process which enables uniform electroless deposition of metals onto substrates formed from caprolactam polymers, particularly filled substrates.

The process of the invention requires contacting the caprolactam article with an aqueous organic acid etch solution comprising an organic acid compound containing from 2 to 4 carbon atoms and having a solubility in water of at least 3 percent by weight of the solution. Contact is for a time sufficient to render the surface uniformly receptive to a metal catalyst and for filled caprolactams microporous to provide anchor sites for the deposited plate. It is preferred to use a solution of an acetic acid compound as defined below.

As part of the process measures, water rinsing with deionized water is performed for good housekeeping between each step. The substrate may be pre-treated with a dilute solution of solvent for the polyamide, preferably an alkali soluble solvent, to soften the surface of the substrate to promote etch. The solvent for the polyamide may be contained in a separate bath or part of an alkaline conditioning solution, as herein defined.

In addition, the substrates may be contacted with an acidic or basic solution subsequent to etch to remove debris present on the surface of the substrate. A basic solution is preferred, as some acid solutions can degrade the caprolactam polymer. To this end, the acid rinse should be less than about 4N in acid concentration, preferably less than about 3.5N.

The caprolactam polymers to be conditioned are known as Nylon 6.

The essential step of the process is contact of the caprolactam substance with an aqueous organic acid etch solution containing at least one organic acid having from 2 to 4 carbon atoms, preferably at least one acetic acid compound. The presently preferred aqueous organic etch is one comprising at least about 3 percent by weight of solution, preferably 5 to about 60 percent by weight, and more preferably, from about 10 to about 25 percent by weight of solution of at least one acetic acid compound of the formula:

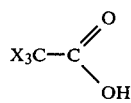

where each X is independently hydroxyl, hydrogen or halogen, with halogen preferred. Contact is at room temperature, although elevated temperatures may be employed. Contact times range from about 10 seconds to 15 minutes, preferably from 0.25 to about 3 minutes, for a time sufficient to etch the surface of the caprolactam to a degree that it becomes uniformly receptive to seeding by a metal electroless plating catalyst. When the caprolactam is filled, the surface is rendered microporous, providing anchor sites for the subsequently deposited plate.

Among the acetic acid compounds which may be used there may be mentioned trichloroacetic acid, acetic acid, hydroxyacetic acid, dichloroacetic acid, chloroacetic acid, fluoroacetic acid, difluoroacetic acid, trifluoroacetic acid, bromacetic acid, dibromacetic acid and the like. Trichloroacetic acid is presently preferred.

Although several of the above acids are solvents for polyamides, they do not play a solvent function in the process. Rather, their prime role is to create, expecially for filled polyamides, surface micropores which serve as anchor sites for the deposited plate. To this end, exposure time should be minimized to retard solvent action, as the acids tend to be absorbed by the surface and induce long-term surface softening. This does not detract from bond strength, but if extensive, will form for a period of time a soft, easily scored surface.

An optional step of the process is contacting the caprolactam substrate with an aqueous alkaline conditioning solution having a pH of at least 10 to condition the surface prior to contact with the aqueous organic acid etch solution. It is presently preferred that the alkaline conditioning solution contain at least one alkali metal hydroxide, such as sodium and/or potassium hydroxide. The alkali employed should be present in a concentration from about 2 percent to solution saturation, preferably from about 10 to about 50 percent by weight. Solution temperature is maintained from ambient to the lesser of the boiling point of the solution and the softening point of the caprolactam substrate, preferably from a temperature of about 150° F. to about 200° F. Contact time may vary from about 0.5 to 20 minutes or more, depending upon temperature and the alkali concentration. It has been found that prolonged immersions will not damage the substrate, but will shorten contact time in the aqueous organic etch solution, which minimizes the amount of the organic acid absorbed by the caprolactam. Besides the alkali metal hydroxides, there may be employed alkaline compounds such as sodium metasilicate, trisodium phosphate, sodium carbonate and the like, used alone and/or in combination with an alkali metal hydroxide.

There may also be employed as part of the process, treatment with a solvent for the surface of the caprolactam to soften the surface to aid attack by the aqueous organic acid. The solvent may be a separate bath used alone, preceding or following the alkaline conditioner or included in the alkaline conditioner. Typically, concentration of the solvent is up to about 5 percent by weight, preferably up to about 1 percent by weight. A wide variety of solvents for polyamides may be used. The presently preferred solvents are ethylene glycol, phenols such as chlorophenol, cresols and the like, and salts thereof. While the solvent serves to soften the surface of the caprolactam substrate to promote etching, the solvent does not etch the surface.

In addition, subsequent to etch the caprolactam substrate may be brought into contact with an acid or basic solution to cleanse the surface of debris, i.e. filler and/or degradated resin. Such solutions are normally maintained at room temperature, although elevated temperatures may be employed. Concentrations are in the range of up to about 20 percent by weight, preferably up to about 10 percent by weight. Functional acids include hydrochloric acid, sulfuric acid, phosphoric acid, nitric acid, formic acid, acetic acid and the like. There may also be employed the alkaline solution used for conditioning as well as salt solutions, such as solutions of borates, silicates, phosphates, bisulfates and the like. The concentration is that which will enhance usrface finish without detracting from the ability of the etched surface to accept a metal catalyst.

A basic solution is preferred, as basic solutions do not degrade the surface of the polyamide. Acid solutions by contrast if too strong, will degrade the surface and remove the micropores provided by a functional aqueous acid etch solution. It has been observed that surface degradation of filled polyamides will occur for strong acids at concentrations of 4N or less. Although dependent on the polyamide itself and strength of the acid, it is generally desirable to avoid the use of acids at a concentration above about 4N. Preferably, acid concentration should be less than 3.5N. This criteria may also be used in selecting acid concentration for the aqueous organic acid etch solution.

Whether or not the cleansing treatment is employed, the article is rinsed in water, usually deionized water, and seeded with a metal electroless plating catalyst contained in an aqueous medium. The catalyst may be noble or non-noble metal based. The use of a noble metal catalyst contained in an aqueous medium is preferred. By a noble metal catalyst contained in an aqueous medium, there is meant an ionic solution or colloidal suspension of the free metals. Colloidal suspensions are preferred. The noble metals include gold, platinum and palladium, with palladium preferred. Suitable non-noble metal catalysts are described in U.S. Pat. No. 3,958,048 assigned to the same assignee as this application and incorporated herein by reference.

A suitable ionic bath is one containing palladium chloride in a concentration of about 0.2 grams per liter solution and 3 ml of concentrated hydrochloric acid per liter of solution. Following seeding, the palladium can be reduced to the free metal state by immersion in a bath of a reducing agent such as dimethyl amine-borane.

Colloidal suspensions of noble metals are described in U.S. Pat. No. 3,011,920 to C. R. Shipley, Jr., incorporated herein by reference. The presently preferred colloidal supension is one which is about 1.7 molar in hydrochloric acid (HCl). Such suspensions are colloidal in nature in which the noble metal colloid is maintained in suspension by a protective colloid, i.e. stannic acid colloids. Following seeding, the colloid is removed by immersion in an acidic or alkaline accelerator solution to remove the protective colloid and expose the absorbed noble metal.

Although less preferred, there may also be employed a seeding method which involves contacting the etched article with a sensitizing solution containing stannous chloride followed by immersion in an activator solution, such as a palladium chloride solution, where the ionic palladium is reduced to the free metal on the surface of the substrate.

Suitably activated, the article may be electrolessly plated by conventional means. Electroless copper and nickel formulations, such as those described in U.S. Pat. Nos. 3,011,920 and 3,874,072, incorporated herein by reference, may be employed. Electroless copper solutions are typically based on a soluble copper salt, such as copper sulfate, a complexing agent for the cupric ion such as Rochelle salt, an alkali hydroxide for adjustment of pH, a carbonate radical as a buffer and a reducing agent for the cupric ion such as formaldehyde.

Following electroless plating, the substrate may be electrolytically plated by conventional means, with copper, nickel, gold, silver, chromium and the like to provide the desired finish on the article.

EXAMPLE

An article molded of Capron ™ 1030, a filled Nylon 6, manufactured and sold by Allied Chemical Corporation, was contacted with a 15 percent by weight to volume aqueous solution of trichloracetic acid solution maintained at room temperature for 5 minutes. After rinsing in deionized water, the article was seeded by contact with a proprietary colloidal tin-palladium catalyst, as described in U.S. Pat. No. 3,011,920, at an acid molarity of about 1.7. An alkaline accelerator was used to expose the palladium metal. The catalyst was maintained at about 120° F. and the accelerator at about 105° F. The seeded article was electrolessly plated using Cuposit ™ PM-990, manufactured and sold by the Shipley Company. The electroless plating solution was maintained at room temperature.

Following electroless plating, the article was rinsed in deionized water, soaked in an alkaline cleaner, passed to a reverse current cleaner, an acid dip, bright acid copper and nickel electrolytic plating solutions, and finally to a chromium plating solution.

The plated article was subjected to a cycle test to determine adhesion performance under thermal stress conditions. In this test, the plated article was maintained at a temperature of 180° F. for 1 hour, then cooled to and maintained at room temperature for 30 minutes then cooled to $-20°$ F. and maintained at that temperature for 1 hour. The cycle test was passed.

DETAILED DESCRIPTION OF FIGS. 1 AND 2

Tests were conducted to illustrate the effect of performing steps useful in the conduct of the invention and adverse to the invention on the surface of articles molded of Nylon 6 or caprolactam (Capron 1030). For each test, two or a multiplicity of articles were subject to the treatment. Two were removed from each stage of the treatment and any remaining passed on to a next stage.

A sample approximately $\frac{1}{2}$ inch square was cut from one article. It was gold sputtered, and the surface was photographed using a scanning electron microscope with the electron beam disposed at an angle of 30 degrees to the sample surface. The companion article was subjected to the plating operation as detailed above. The first step of the plating operation was electroless plating. If no failure occurred, the article was electroplated with copper, nickel, then chrome. If no failure occurred, the article was baked for four hours at 230° F. to normalize the plastic. It was then cycle tested by heating to 230° F. for one hour and then cooled to $-30°$ F. for one hour, and finally, if no failure occurred, to peel testing.

The solutions used in treating the articles were as the aqueous alkaline conditioning solution, a 15% weight-to-volume aqueous solution of sodium hydroxide maintained at 200° F. (15% NaOH solution). As the aqueous organic acid etch solution there was employed a 15% weight-to-volume aqueous solution of trichloroacetic acid (15% TCA solution) maintained at room temperature. As a solvent solution there was employed a 5% volume-to-volume aqueous room temperature solution of parachlorophenol (PCP solution). As alternate test solutions, there were employed a 4 Normal aqueous solution of hydrochloric acid (4N. HCl solution), an aqueous chromic acid solution containing 9.5 pounds of chromic acid per gallon of solution and maintained at 150° F., as described in U.S. Pat. No. 3,366,130, and as the formic acid solution a 45% v/v room-temperature (70° F.) solution of formic acid in water.

FIG. 1 (a) is at 3500× magnification. All others are split photographs showing an area at 1000×, and scored sections of the area at 3000× magnification.

FIG. 1 (b) illustrates the molded surface of Capron 1030 magnified 3500×.

Figure 1B:
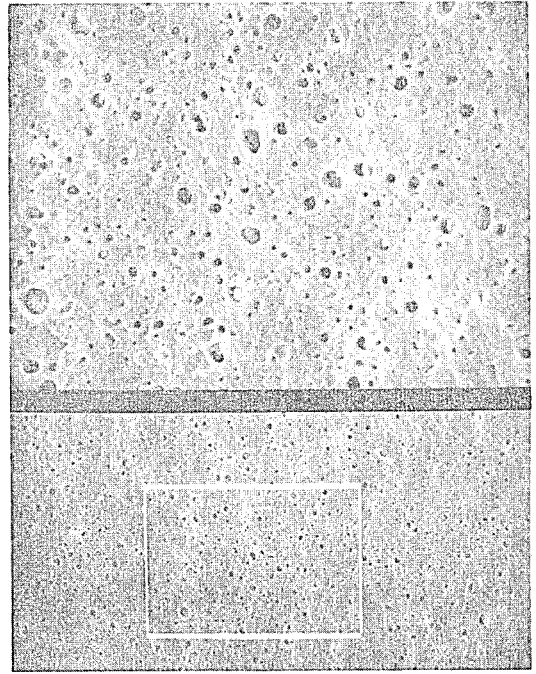

Exposure for 10 minutes to the 15% NaOH solution, then 30 seconds to the 15% TCA solution, gave an electroplated part having a very good appearane and a surface adhesion of 8.0 lbs/in. The exposed plastic surface of a companion article is shown in FIG. 1(b). Magnification is 1000× and 3000×. The developed micropores are evident.

Figure 1C:
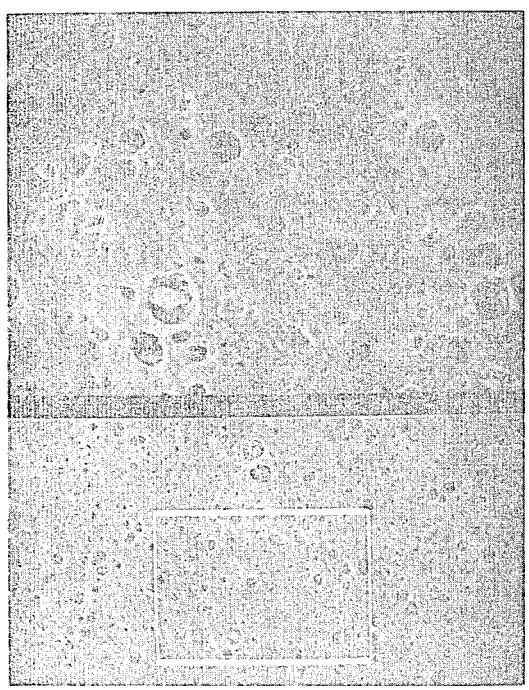

When treatment with the 15% NaOH solution and the 15% TCA solution, as described above, was followed with exposure of 5 minutes, using the 15% NaOH solution as a cleanser, the surface appearance, again, was very good, and adhesion was 7.6 lbs/in. FIG. 1(c) shows the condition of the companion substrate with micropores slightly larger than in FIG. 1(b) at the same level of magnification.

Figure 1D:
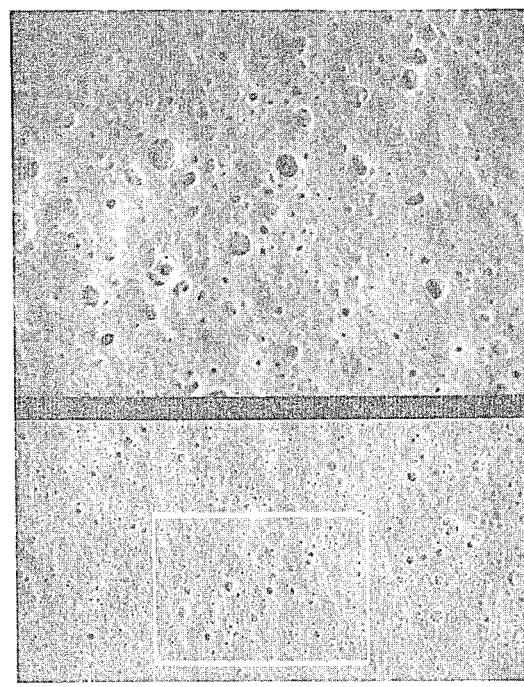

As shown in FIG. 1(d), the anchor sites were developed when a room-temperature 15% NaOH solution was employed. Again, magnification is 1000× and 3000×. In this instance, appearance of the companion electroplated article was very good, and adhesion was 6.4 lbs/in.

Figure 1E:
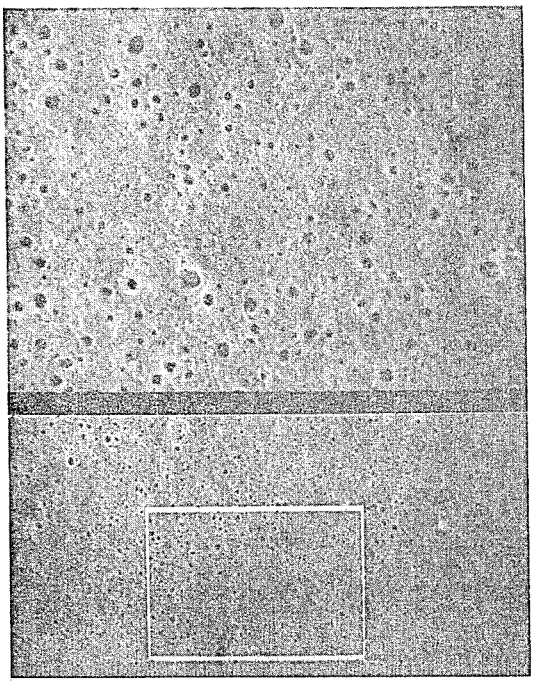

The use of trichloroacetic acid alone is, for filled caprolactam, functional to develop microporous anchor sites. FIG. 1(e) shows a surface after exposure for 30 seconds to the 15% TCA solution alone. A companion article electroplated to a bond strength of 7.0 lbs/in. and had a good appearance.

Figure 1F:
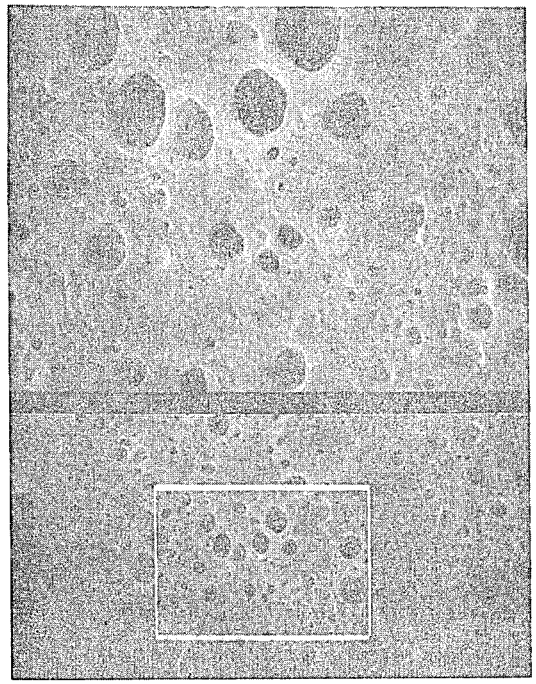

As shown in FIG. 1(f), increasing exposure to 5 minutes appeared to enlarge the size of the holes. The companion electroplated article had a fair electroplate appearance with soft undersurface and a bond strength of 6.1 lbs/in.

Figure 1G:
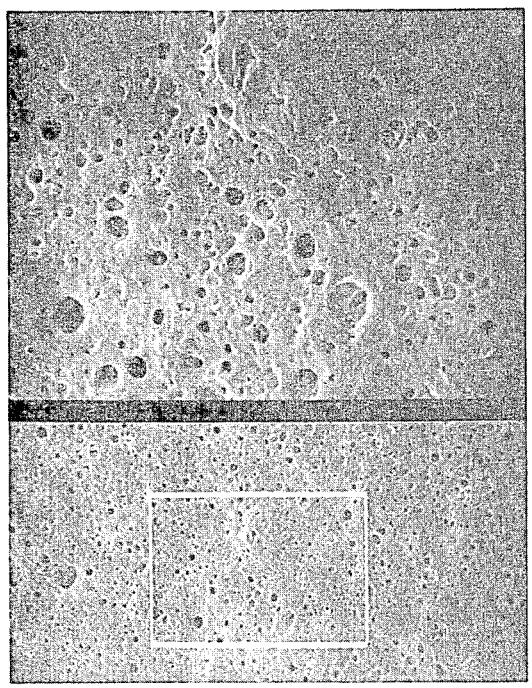

The result of using the PCP solution for 5 minutes as an intermediate step to soften the surface of the plastic is illustrated in FIG. 1(g). Again, at the 1000× and 3000× magnification, there are well developed micropores, and an electroplated companion article had a good appearance and a bond strength of 7.5 lbs/in. Contact with the PCP solution was intermediate of contact for 10 minutes with the 15% NaOH solution and 30 seconds in the 15% TCA solution.

Figure 1H:
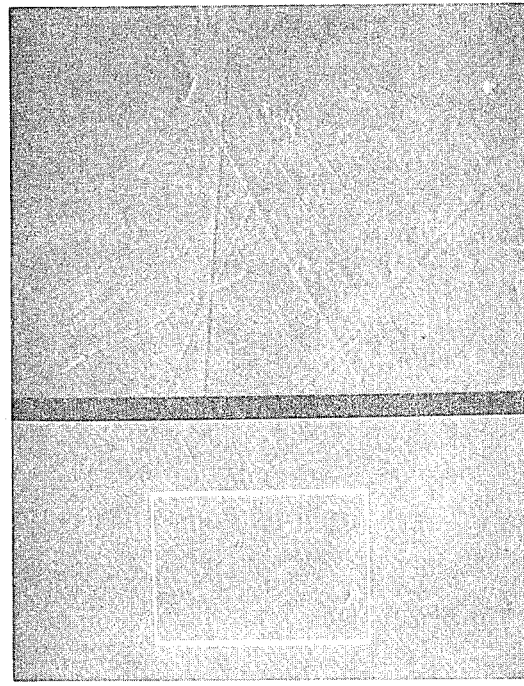

Where, however, there was only exposure for 10 minutes to the 15% NaOH solution and 5 minutes with the PCP solution, there was, as shown in FIG. 1(h), no apparent change in the surface. Magnification was 1000× and 3000×. The plate on a companion article blistered during electroless plating.

Figure 1I:
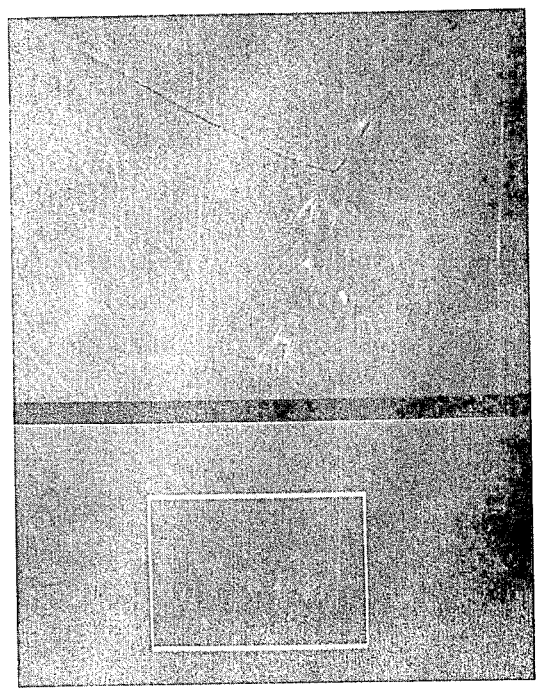

Treatment for 10 minutes in the 15% NaOH solution, followed by contact for 5 minutes in the PCP solution, and 5 minutes in the 15% NaOH solution as a cleanser also did not result in an apparent change in the surface, as shown in FIG. 1(i). Again, the plate on the companion plaque blistered during electroless plating.

Figure 1J:
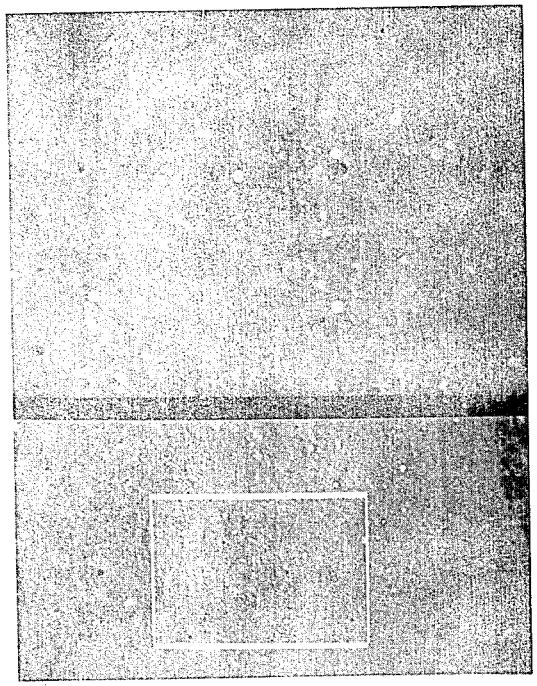

As shown in FIG. 1(j), exposure of an article treated for 10 minutes in the 15% NaOH solution and 30 seconds in the 15% TCA solution, and rinsing for 5 minutes in 4N. HCl resulted, as compared to FIG. 1(b), in essential loss of the micropores. An electroplate on a companion article had a very poor appearance and failed during the 4-hour bake.

Figure 1K:
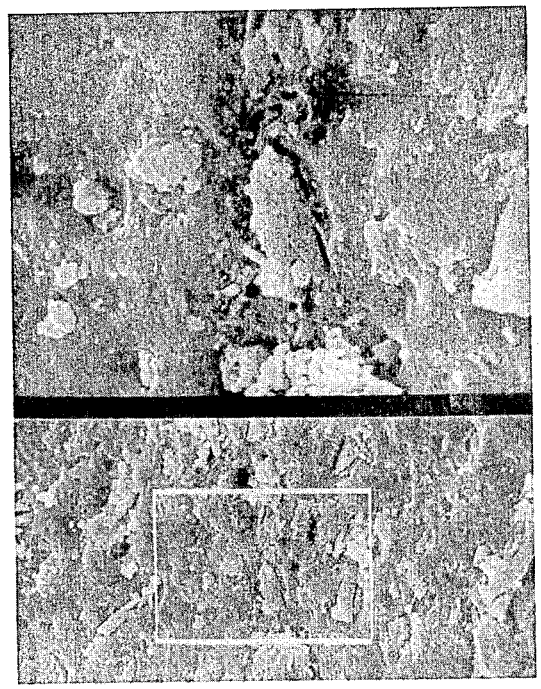

FIG. 1(k) depicts effects of the chromic acid solution following conditioning for 10 minutes with the 15% NaOH solution and etch in the 15% TCA solution for 30 seconds. The entire surface was degraded.

Figure 2A:
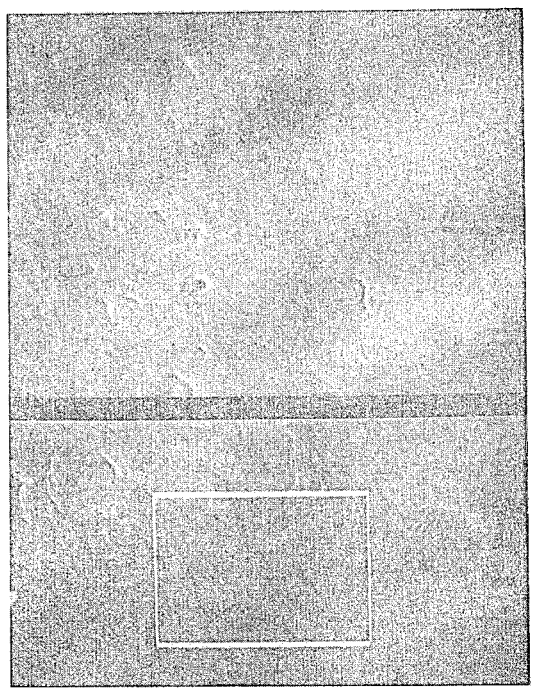
Figure 2B:
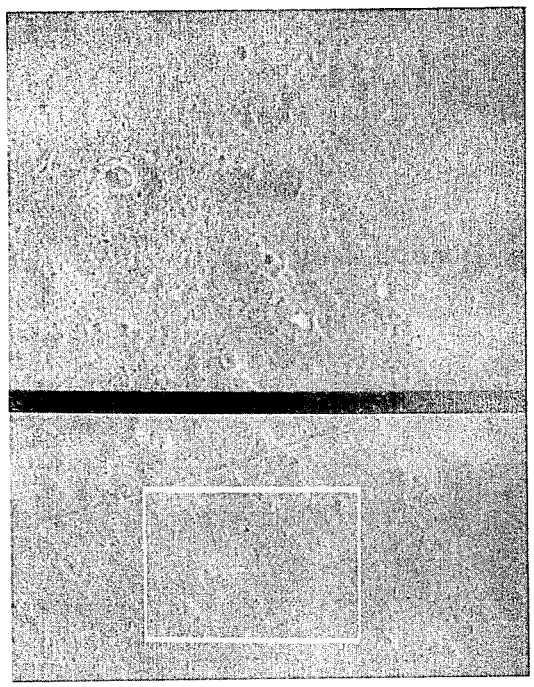
Figure 2C:
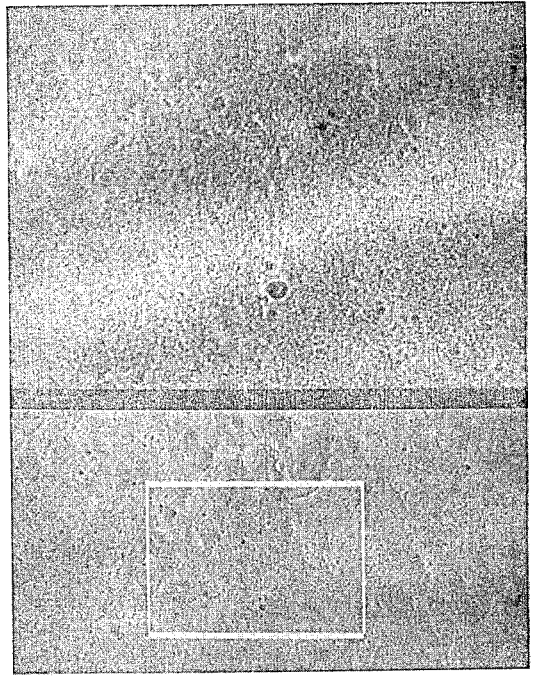

FIGS. 2(a), 2(b), and 2(c) depict at 1000× and 3000× the effect of the formic acid solution on the surface of Capron 1030. As shown in FIG. 2(a), 10 minutes exposure to the 15% NaOH solution, followed by 30 seconds exposure to the formic acid solution, had no effect on the surface. A companion plaque blistered during electroless plating.

Exposure to formic acid alone for 30 seconds, as shown in FIG. 2(b), resulted in some surface erosion, while increasing exposure to 5 minutes resulted in a high degree of erosion of the surface [FIG. 2(c)]. In neither instance did the companion article accept an electroless plate, as blisterings occurred during the electroless plating operation.

What is claimed is:

1. A process for etching the surface of a caprolactam polymer substrate for electroless plating which comprises etching the caprolactam substrate with an aqueous organic acid etch solution comprising at least one organic acid compound containing 2 to 4 carbon atoms in the molecule and soluble in a concentration of at least about 3 percent by weight of solution and present in a concentration sufficient to render the caprolactam substrate uniformly and directly receptive to a metal electroless plating catalyst and depositing a metal electroless plating catalyst on the etched caprolactam polymer substrate.

2. A process as claimed in claim 1 in which the caprolactam polymer substrate is contacted, prior to contact with the aqueous organic acid etch solution, with a dilute aqueous solution of an organic solvent for caprolactam for a time sufficient to soften the surface of the caprolactam substrate.

3. A process for etching the surface of a caprolactam polymer substrate for electroless plating which comprises contacting the caprolactam polymer substrate with an aqueous organic acid etching solution comprising at least one acetic acid compound having the formula:

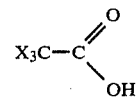

wherein each X is independently selected from the group consisting of hydrogen, hydroxyl and halogen and in which the acetic acid compound is present in a concentration sufficient to render the caprolactam substrate uniormly and directly receptive to a metal electroless plating catalyst and depositing a metal electroless plating catalyst on the etched caprolactam polymer substrate.

4. A process as claimed in claim 3, in which the caprolactam polymer substrate is formed of a filled caprolactam polymer.

5. A process as claimed in claim 3, in which the total acetic acid compound concentration of the conditioning solution is from about 3 percent by weight of the solution to solution saturation.

6. A process as claimed in claim 3, in which the total acetic acid compound concentration of the conditioning solution is from about 5 to about 60 percent by weight of the solution.

7. A process as claimed in claim 3, in which the caprolactam polymer substrate is contacted with the conditioning solution for a period of from about 10 seconds to about 15 minutes.

8. A process as claimed in claim 3, in which the acetic compound is trichloroacetic acid.

9. A process as claimed in claim 3, in which the caprolactam polymer substrate is contacted, prior to contact with the aqueous etch solution, with a dilute aqueous solution of an organic solvent for caprolactam polymer for a time sufficient to soften the surface of the caprolactam polymer substrate.

10. A process for etching the surface of caprolactam polymer substrates for electroless plating which comprises contacting the caprolactam polymer substrate with an aqueous organic acid etch solution of trichloroacetic acid in which the trichloroacetic acid is present in a concentration of from about 5 percent by weight to solution saturation for a time of from about 10 seconds to 15 minutes to render the caprolactam polymer substrate uniformly and directly receptive to a metal electroless plating catalyst and depositing a metal electroless plating catalyst on the etched caprolactam polymer substrate.

11. A process as claimed in claim 10, in which the caprolactam polymer substrate is formed of a filled caprolactam polymer.

12. A process as claimed in claim 10, in which the concentration of trichloroacetic acid in solution is from about 5 to about 60 percent by weight of the solution.

13. A process as claimed in claim 10 in which the caprolactam polymer substrate is contacted, prior to contact with the aqueous etch solution, with a dilute aqueous solution of an organic solvent for the caprolactam polymer for a time sufficient to soften the surface of the caprolactam polymer substrate.

* * * * *